(12) United States Patent
Colinge

(10) Patent No.: US 8,963,206 B2
(45) Date of Patent: Feb. 24, 2015

(54) METHOD FOR INCREASING FIN DENSITY

(75) Inventor: Jean-Pierre Colinge, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 106 days.

(21) Appl. No.: 13/595,232

(22) Filed: Aug. 27, 2012

(65) Prior Publication Data

US 2014/0054650 A1    Feb. 27, 2014

(51) Int. Cl.
*H01L 29/66*    (2006.01)

(52) U.S. Cl.
USPC .............................. 257/192; 257/213; 438/197

(58) Field of Classification Search
USPC .................. 257/E21.409, E21.255, 401, 347, 257/E27.06, E27.112, E29.264, 365, 368, 257/E21.09, 221.421, E21.619–E21.635; 438/197
See application file for complete search history.

(56) References Cited

U.S. PATENT DOCUMENTS

| | | | |
|---|---|---|---|
| 7,208,815 B2 * | 4/2007 | Chen et al. | ..................... 257/627 |
| 7,667,271 B2 | 2/2010 | Yu et al. | |
| 8,053,299 B2 | 11/2011 | Xu | |
| 2006/0048697 A1 * | 3/2006 | Houge et al. | ..................... 117/11 |
| 2006/0214226 A1 * | 9/2006 | Chen et al. | ..................... 257/347 |
| 2006/0292770 A1 * | 12/2006 | Wu et al. | ...................... 438/187 |
| 2008/0048269 A1 * | 2/2008 | Chen et al. | ..................... 257/368 |
| 2011/0147842 A1 * | 6/2011 | Cappellani et al. | ........... 257/365 |
| 2012/0146101 A1 * | 6/2012 | Lin | .............................. 257/255 |

OTHER PUBLICATIONS

Hua, Xuefeng, et al.; "Studies of Plasma Surface Interactions During Short Time Plasma Etching of 193 and 248nm Photoresist Materials", Journal of Vacuum Science and Technology B, Aug. 15, 2012, http://dx.doi.org/10.1116/1.2217973, p. 1-10.

* cited by examiner

*Primary Examiner* — Julio J Maldonado
*Assistant Examiner* — Robert Bachner
(74) *Attorney, Agent, or Firm* — Eschweiler & Associates, LLC

(57) ABSTRACT

The present disclosure is directed to a method of manufacturing a FinFET structure in which at least one initial set of fin structures is formed by photolithographic processes, followed by forming an additional fin structure by epitaxial growth of a semiconductor material between the initial set of fin structures. The method allows for formation of FinFET structures having increased fin density.

19 Claims, 4 Drawing Sheets

METHOD FOR INCREASING FIN DENSITY

BACKGROUND

The semiconductor industry continues to have goals of higher density, superior performance, and lower cost. Scaling of device size has been a major tool used to reach these goals. However, scaling beyond the 100 nm process technology node has several difficulties associated with it, such as gate-oxide thickness, source and drain doping depths, and current density. These difficulties have resulted in new device structures to improve the existing metal oxide semiconductor field effect transistor (MOSFET) devices. Some of these new device structures include multi-gate MOSFET devices. A Fin field effect transistor (FinFET) or trigate FET or multigate FET (MuGFET) is a kind of multi-gate device which has a channel region formed as a vertical fin. Multiple gates are formed over and along the sides of the vertical fin. A FinFET allows for a range of channel lengths and provides a broader process window for gate structures. FinFET devices typically include high aspect-ratio semiconductor fins in which the channel and source/drain regions for the transistor are formed. The increased surface area of the channel and the electrostatic control of the channel by gates on multiple sides of the device in a FinFET results in faster and better-controlled semiconductor transistor devices. These advantages have found many new applications in various types of semiconductor devices.

DETAILED DESCRIPTION

Figure 1A:
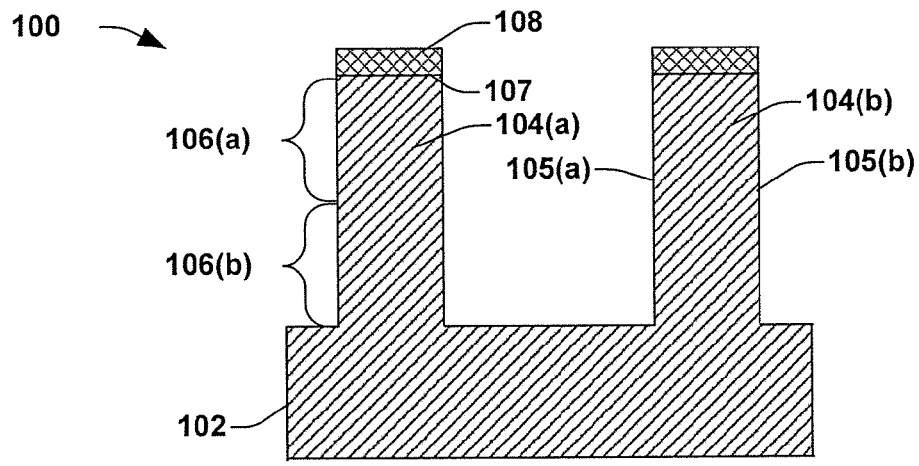
FIGS. 1A-1F are partial cross sectional views illustrating steps of one embodiment of forming a semiconductor FinFET device in accordance with the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Here, the term FinFET will be used indiscriminately to describe the different types of Fin field effect transistors (such as FinFETs, trigate FETs, multigate FETs (MuGFETs), pi/omega gate FETs, gate-all-around (GAA) FETs). FinFETs use a substantially rectangular fin structure which can be formed in several ways. In a first method, bulk silicon on a substrate is etched into rectangular fin shape by first depositing a mask or hardmask layer on the bulk silicon. The hardmask forms a pattern covering the top of the fins. The bulk silicon is then etched to form trenches between the regions covered by the hardmask layer. The trenches are formed into shallow trench isolation (STI) features by depositing a dielectric material, usually silicon oxide, into the trench. The dielectric material is usually deposited in excess to completely cover the fins and optionally the hardmask layer if not already removed. The dielectric material is planarized down to the top surface of the fin/hardmask, and then etched to a level below the top of the fin so that a portion of the fin protrudes above the STI.

In a second method, the STI features are formed first on bulk silicon material by depositing an STI layer and etching trenches into it. The bottoms of the trenches between the STI features are exposed bulk silicon. Silicon is then grown in the trenches to form the fins by using, for example, an epitaxial process. Once a desired fin height is reached, then the STI is etched to a level below the top of the fin to expose a portion of the fin. The bulk silicon material may be a silicon substrate or deposited silicon such as silicon-on-insulator (SOI) with a barrier oxide (BOX) layer between the SOI and the underlying silicon substrate.

Both methods above use a photolithography process at the desired fin dimension, often at or beyond the limit of the current photolithography technology.

Accordingly, the present disclosure is directed to a method of increasing the fin density of a FinFET structure. The method further allows a reduction in fin pitch, thereby increasing current by unit area and integration density.

FIGS. 1A-1F illustrate a plurality of partial cross section diagrams illustrating one embodiment of a method of forming a FinFET structure at stages in the manufacturing process according to the disclosure. Referring to FIG. 1A, an area of a substrate 102 including at least one set of initial fin structures 104(a), 104(b) is provided. The substrate 102 can include any semiconductor material and can comprise known structures, including a graded layer or a buried oxide, for example. In one embodiment, the substrate 102 comprises bulk silicon that may be doped or undoped (e.g., p-type, n-type, or a combination thereof). Other materials that are suitable for semiconductor device formation can be used. Other materials, such as germanium, silicon-germanium alloy, sapphire, and III-V semiconductor compounds could alternatively be used for the substrate 102. Alternatively, the silicon substrate 102 can be an active layer of a semiconductor-on-insulator (SOI) substrate.

The initial fin structures 104(a), 104(b) can be formed, for example, by patterning and etching into the substrate 102 by using photolithography techniques. Generally, a layer of photoresist material (not shown) is deposited over the substrate 102. The layer of photoresist material is irradiated (exposed) in accordance with a desired pattern (the initial fin structure 104(a), 104(b) in this case) and developed to remove a portion of the photoresist material. The remaining photoresist material protects the underlying material from subsequent processing steps, such as etching.

A mask layer 108 is deposited by, for example, a CVD, LPCVD or plasma CVD process, over top of fin structures 104(a), 104(b). The mask layer 108 serves to prevent growth of silicon or other semiconductor material over the initial set of fin structures during formation of additional fin structures, and acts as an etch stop in subsequent chemical mechanical polishing (CMP) processes. In some embodiments, the mask layer 108 comprises a material, for example, such as a nitride.

Figure 1B:
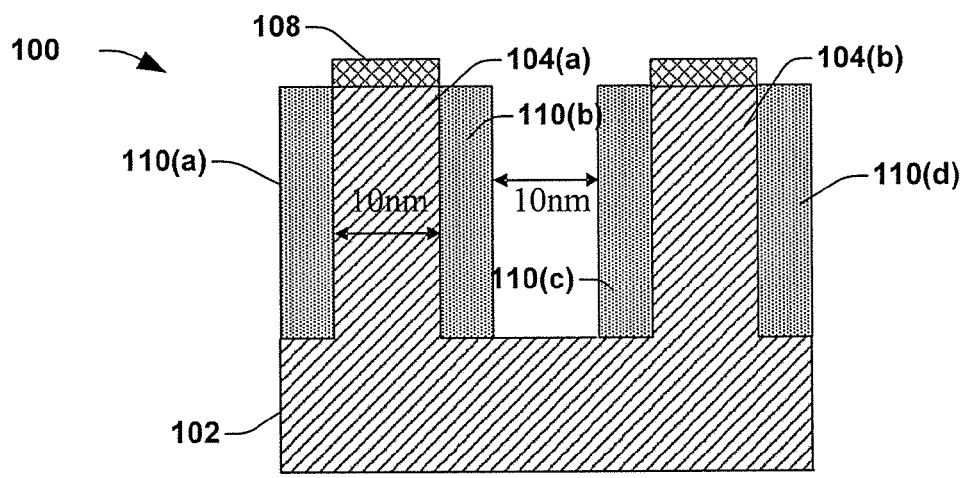

In FIG. 1B, sidewall spacers 110(a), 110(b), 110(c), 110(d) are formed by depositing a spacer material and patterning the material by, for example, performing an isotropic etch process. In one embodiment, the spacers 110(a-d) are formed of an oxygen-containing material such as silicon oxide ($SiO_2$). A $SiO_2$ layer can be formed using chemical vapor deposition (CVD) techniques, thermal oxidation, plasma-enhanced CVD or a combination of these techniques. Once formed, an isotropic etch process can be used to remove material on top of the mask 108 and the areas of the substrate 102 not immediately adjacent to opposing sidewalls 105(a), 105(b), leaving the sidewall spacers 110(a-d) as illustrated in FIG. 1B. Sidewall spacers 110(a), 110(b), 110(c), 110(d) can be formed such that the distance between adjacent spacers is equal to a width of the initial fin structures 104(a), 104(b). Thus, as illustrated in FIG. 1B, the initial fin structures 104(a), 104(b) have a width of 10 nm, and the distance between adjacent spacers 110(b), 110(c) is 10 nm. It is contemplated, however, that initial fin structures having widths different from 10 nm is possible and within the scope of the invention.

Figure 1C:
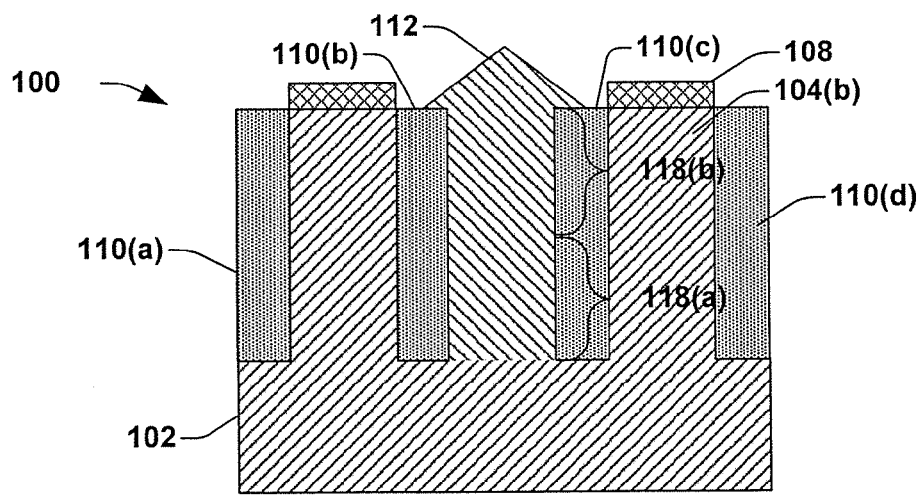

In FIG. 1C, an additional fin structure 112 is formed between the initial set of fin structures 104(a), 104(b). The additional fin structure 112 can be formed, in one embodiment, by epitaxial growth of a layer on the substrate 102. The layer can include, in one embodiment, a silicon layer. In another embodiment, the fin structure 112 can include a Group III-V semiconductor material. In another embodiment, the fin structure 112 can include a Group V semiconductor material such as germanium or a silicon-germanium alloy. The epitaxial process can include processes such as vapor phase epitaxy (VPE), molecular beam epitaxy (MBE), liquid phase epitaxy (LPE), and/or other suitable processes.

In one embodiment, the additional fin structure 112 can be doped as the fin is grown such that the fin has a second conductivity that is different from the first conductivity of the initial set of fin structures 104(a), 104(b). For example, in one embodiment, a silicon fin can be formed by epitaxially growing silicon in an ambient of phosphorus to form an N-type conductivity, and the initial set of fin structures 104(a), 104(b) can have a P-type conductivity. In another embodiment, the additional structure 112 can have a P-type conductivity by growing silicon in an ambient of boron, and the initial set of fin structures 104(a), 104(b) can have an N-type conductivity.

In a further embodiment, the epitaxially grown fin structure 112 can be doped after the fin structure 112 has been grown. For example, a silicon fin can be doped after it has been grown by implanting phosphorous ions to form an N-type conductivity. In another embodiment, a silicon fin can be doped with boron ions to form a P-type device. Other N-type and P-type dopants can be used.

In yet another embodiment, the additional fin structure 112 can be formed by epitaxially growing a bottom portion 118(a) of the additional fin structure 112 of a first semiconductor material, followed by epitaxially growing a top portion 118(b) of the additional fin structure 112 of a second semiconductor material. The epitaxially grown portions 118(a), 118(b) includes epitaxially-grown (epi) semiconductor material. In one embodiment, the epitaxially grown portion 118(a) includes SiGe and portion 118(b) includes germanium. Other compositions can include other Group III-V materials such as InP, InGaAs, InAs, combinations thereof, and/or other suitable materials. The epitaxially grown portions 118(a), 118(b) can be doped, or undoped, during formation. In an embodiment, the epitaxially-grown semiconductor material includes a different composition (e.g., at least one different element) than the substrate. For example, in an embodiment, the epitaxially-grown material is germanium and the substrate is silicon.

Figure 1D:
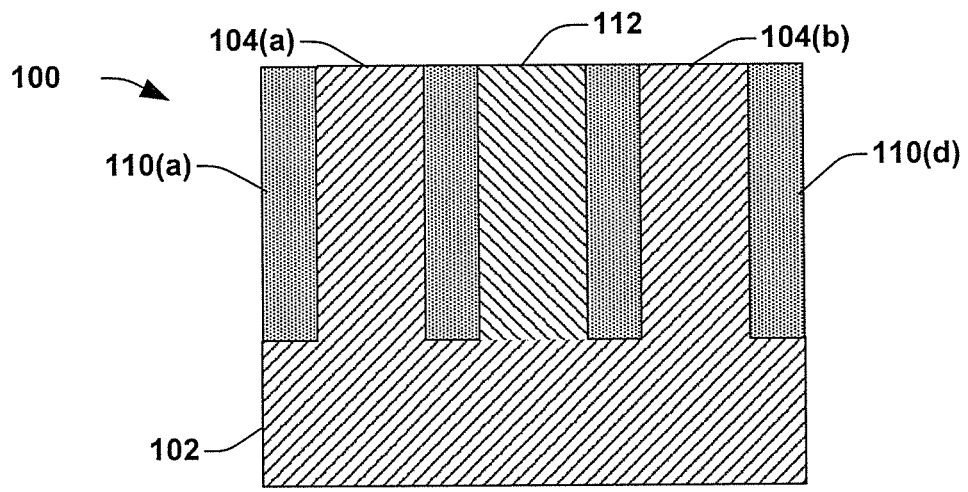
Figure 1E:
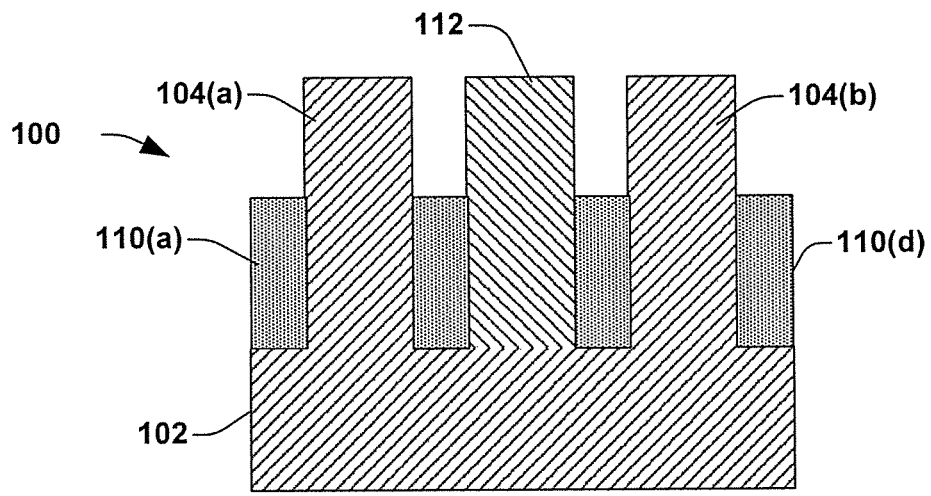

In FIG. 1D, a CMP process is performed to remove any overgrowth of the epitaxially grown additional fin structure 112 overlying the sidewall spacers 110(b), 110(c), as well as removing the mask 108. In one embodiment, the overgrowth is removed to a top surface of the initial fin structures 104(a), 104(b). The sidewall spacers 110(a-d) are then recessed in FIG. 1E to expose an top portion of opposing sidewalls of initial fin structures 104(a), 104(b) and additional fin structure 112. The spacers 110(a-d) can be recessed using an etch process.

In one embodiment, sidewall spacers 110(a), 110(b), 110(c), 110(d) can be removed to form an opening between an initial fin structure 104(a), 104(b) and additional fin structure 112. A dielectric material can then be deposited in the opening. The dielectric material can be different from the material used to form the spacers 110(a-d). In one embodiment, the dielectric material can be a low k dielectric material, for example, carbon-doped silicon dioxide, also referred to as organosilicate glass (OSG) and carbon-oxide. Low-k materials may also include borophosphosilicate glass (BPSG), borosilicate glass (BSG), and phosphosilicate glass (PSG), among others. The dielectric material can be formed using, for example, tetraethyl orthosilicate (TEOS), chemical vapor deposition (CVD), plasma enhanced CVD (PECVD), low pressure CVD (LPCVD), or spin-on coating techniques In one embodiment, a thin thermal oxide liner is grown on opposing sidewalls 105(a), 105(b) of the semiconductor fin structures 104(a), 104(b), 112 prior to deposition of the dielectric material.

Figure 1F:
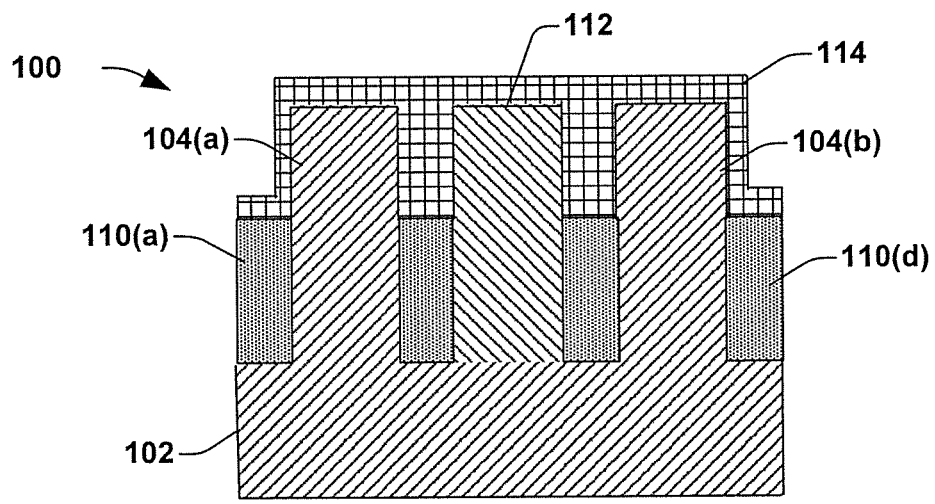

In FIG. 1F, a gate structure 114 is formed overlying the initial fin structures 104(a), 104(b) and the additional fin structure 112. The gate structure 114 can include a gate dielectric layer (not shown) and a gate electrode (not shown). Numerous other layers may also be present, for example, capping layers, interface layers, spacer elements, and/or other suitable features. The gate dielectric layer can include a dielectric material such as silicon oxide, silicon nitride, silicon oxinitride, a high-k material and the like. The gate dielectric can be formed using processes such as photolithography patterning, oxidation, deposition, ALD, etching, and/or other suitable processes. The gate electrode can include polysilicon, silicon-germanium, a metal including metal compounds such as Al, Mo, Cu, W, Ti, Ta, TiN, TaN, TiC, TaC, NiSi, CoSi and/or other suitable conductive materials. The gate electrode can be formed using processes such as physical vapor deposition (PVD), CVD, plasma-enhanced chemical vapor deposition (PECVD), atmospheric pressure chemical vapor deposition (APCVD), low-pressure chemical vapor deposition (LPCVD), high density plasma CVD (HD CVD), atomic layer CVD (AL CVD), or other suitable processes which can be followed, for example, by photolithography or etching processes.

Figure 2:
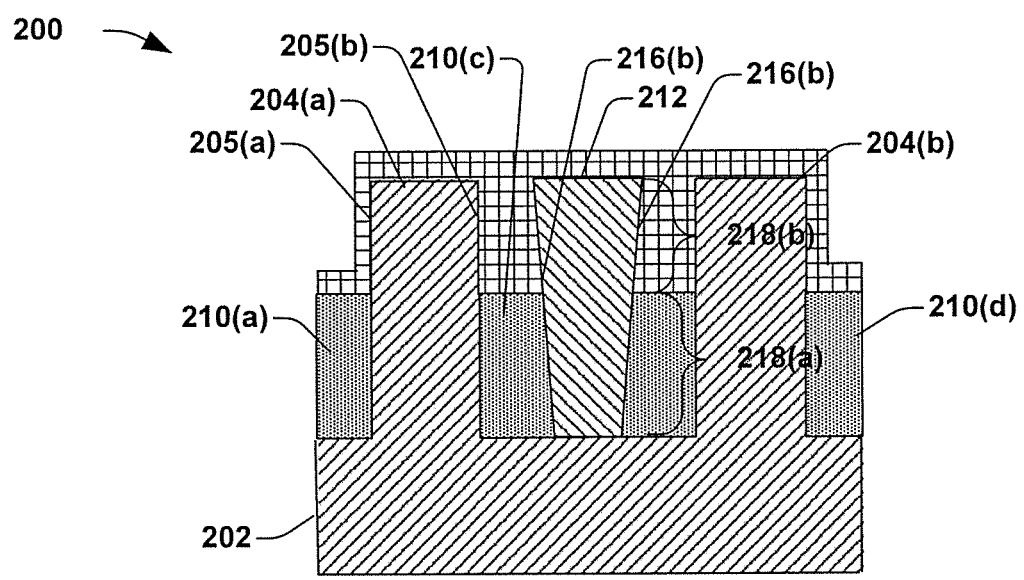
FIG. 2 illustrates a partial cross section view of one embodiment of a fin field-effect transistor in accordance with the disclosure.

FIG. 2 illustrates a FinFET transistor 200 in accordance with an embodiment of the invention. The device includes a substrate 202 having at least two initial fin structures 204(a), 204(b) thereon. The initial fin structures 204(a), 204(b) have opposing sidewalls which have a first shape. The first shape includes sidewalls 205(a), 205(b) of the initial fin structures 204(a), 204(b) which are parallel and substantially defect-free. In one embodiment, the additional fin structure 212 includes angled opposing sidewalls 216(a), 216(b) which taper such that additional fin structure 212 has a wider top 218(a) and narrower bottom 218(b) to form a second shape. In another embodiment, the additional fin structure 212 can include angled opposing sidewalls 216(a), 216(b) such that the fin structure 212 has a wider bottom and a narrower top. Further, a profile of the angled opposing sidewalls 216(a), 216(b) of the fin structure 212 can include, for example, surface defects or a surface roughness which, in one embodiment is absent from the initial fin structures 204(a), 204(b), and in another embodiment is different from that of the initial fin structures 204(a), 204(b). The device 200 further includes spacer material 210(*a*), 210(*c*), 210(*d*) disposed about sidewalls 205(*a*), 205(*b*) of the initial fin structures 204(*a*), 204(*b*).

Figure 3:
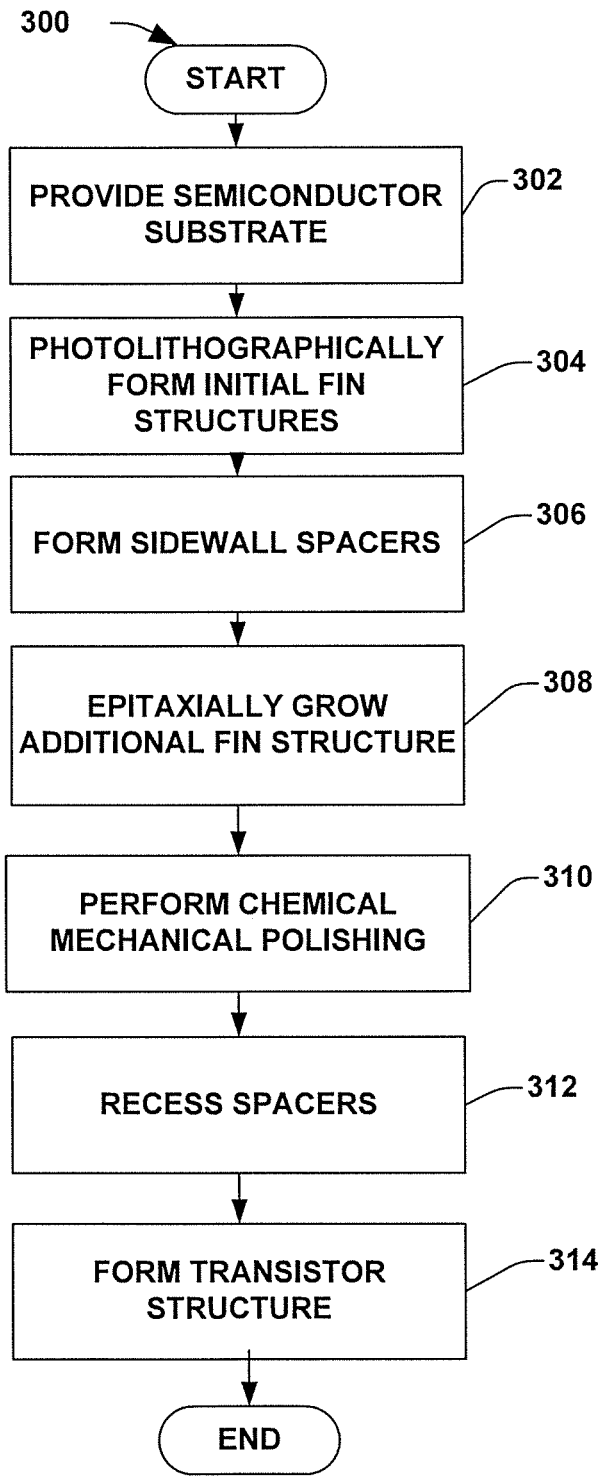
FIG. 3 illustrates a flow diagram of some embodiments of a method for the fabrication of a FinFET structure in accordance with the disclosure.

FIG. 3 illustrates a flow diagram of some embodiments of a method 300 for formation of a FinFET structure according to an embodiment of the invention. While method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 302 a semiconductor substrate is provided. At least two initial fin structures are then formed on the substrate by photolithography processes at step 304.

At step 306, sidewall spacers are formed adjacent opposing sidewalls of the initial fin structures.

At step 308, an additional fin structure disposed between the initial fin structures is formed by epitaxial growth.

At step 310, a chemical mechanical polishing is performed to remove any epitaxial overgrowth.

At step 312, sidewall spacers are recessed to expose a top portion of the initial fin structures.

At step 314, a gate structure is formed overlying the initial fin structures and the additional fin structure. The method then ends such that the sum of the initial and additional fin structures in an area of the substrate is equal to 2n−1, where n equals the number of initial fin structures.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the disclosure relates to a method comprising providing a semiconductor substrate and photolithographically forming at least one set of initial fin structures disposed on the substrate. The initial fin structures include a top and opposing sidewalls having a top portion and a bottom portion. The method further comprises forming sidewall spacers between the set of initial fin structures and adjacent to opposing sidewalls of the initial fin structures. The method further includes epitaxially growing at least one additional fin structure between the initial set of fin structures.

The disclosure further relates to a fin field-effect transistor comprising a substrate having at least two initial fin structures thereon. The initial fin structures include opposing sidewalls having a first shape. The fin field-effect transistor further includes an epitaxially grown fin structure disposed between the two initial fin structures. The epitaxially grown fin structure includes angled opposing sidewalls having a second shape which is different from the first shape of the initial fin structure opposing sidewalls.

What is claimed is:

1. A fin field-effect transistor (FinFET) comprising:
   a substrate having at least two initial fin structures thereon, the initial fin structures each including opposing sidewalls having a top portion and a bottom portion and having a first shape;
   an epitaxially grown fin structure disposed between the two initial fin structures, the epitaxially grown fin structure including angled opposing sidewalls having a top portion and a bottom portion and having a second shape which is different from the first shape of the initial fin structure opposing sidewalls; and
   a pair of spacers which are disposed between the initial fin structures and which are disposed about respective sidewalls of the epitaxially grown fin structure; wherein each spacer of the pair abuts a sidewall of the initial fin structures and abuts a corresponding sidewall of the epitaxially grown fin structure and extends continuously between the sidewall of the initial fin structures and the corresponding sidewall of the epitaxially grown fin structure.

2. The FinFET of claim 1, wherein the initial fin structures comprise a first conductivity type and the epitaxially grown fin structure comprise a second conductivity type.

3. The FinFET of claim 1, wherein the initial fin structures comprise structures which have been etched into the substrate.

4. The FinFET of claim 1, wherein the epitaxially grown fin structure comprises a top portion comprising a first semiconductor material overlying a bottom portion of a second semiconductor material that is different from the first semiconductor material.

5. The FinFET of claim 4, wherein the first or second semiconductor material comprises silicon, silicon germanium, germanium, a Group III-V material, and combinations thereof.

6. The FinFET of claim 1, wherein the first shape of the opposing sidewalls of the at least two initial fin structures are at least substantially parallel.

7. The FinFET of claim 6, wherein the second shape of the angled opposing sidewalls of the epitaxially grown fin structure taper to form a wider top and a narrower bottom or a wider bottom and a narrower top.

8. The FinFET of claim 7, wherein the angled opposing sidewalls of the epitaxially grown fin structure include a profile having a surface defect or a surface roughness different from that of the initial fin structures.

9. The FinFET of claim 1, wherein the substrate comprises silicon.

10. The FinFET of claim 1, wherein a distance between adjacent spacers is equal to a width of the initial fin structure.

11. The FinFET of claim 1, wherein the sum of initial and epitaxially grown fin structures in an area on the substrate is equal to 2n−1, where n equals the number of initial fin structures.

12. The FinFET of claim 1, wherein the pair of spacers comprises silicon dioxide ($SiO_2$).

13. The FinFET of claim 1, wherein a layer of dielectric material is disposed about the opposing sidewalls of the initial fin structures.

14. The FinFET of claim 13, wherein the layer of dielectric material comprises organosilicate glass (OSG), borophosphosilicate glass (BPSG), or phosphosilicate glass (PSG).

15. The FinFET of claim 1, wherein a gate structure overlies the initial fin structures and the epitaxially grown fin structure.

16. The FinFET of claim 15, wherein the pair of spacers covers the bottom portions of the sidewalls of the initial fin structure and the bottom portions of the epitaxially grown fin structure; and the gate structure covers the top portions of the sidewalls of the initial fin structure and the top portions of the sidewalls of the epitaxially grown fin structure.

17. The FinFET of claim 1, wherein the at least two initial fin structures have sidewalls that exhibit a first surface condition that is the same for the at least two initial fin structures, and wherein the epitaxially grown fin structure has sidewalls that exhibit a second surface condition that differs from the first surface condition.

18. The FinFET of claim 17, wherein the first surface condition is established by the sidewalls of the at least two initial fin structures having first sidewall angles, and wherein the second surface condition is established by the sidewalls of the epitaxially grown fin structure having second sidewall angles that are different from the first sidewall angles.

19. The FinFET of claim 17, wherein the first surface condition is established by the sidewalls of the at least two initial fin structures having a first surface roughness or a first surface defect profile, and wherein the second surface condition is established by the sidewalls of the epitaxially grown fin structure having a second surface roughness or a second surface defect profile that is differ from the first surface condition.

* * * * *

UNITED STATES PATENT AND TRADEMARK OFFICE
CERTIFICATE OF CORRECTION

PATENT NO. : 8,963,206 B2  Page 1 of 1
APPLICATION NO. : 13/595232
DATED : February 24, 2015
INVENTOR(S) : Jean-Pierre Colinge et al.

It is certified that error appears in the above-identified patent and that said Letters Patent is hereby corrected as shown below:

In The Claims

Column 6, Claim 8, Line 49 Please replace "...fin structure include..." with
--...fin structure includes...--

Signed and Sealed this
Twenty-sixth Day of May, 2015

Michelle K. Lee
*Director of the United States Patent and Trademark Office*